(12) United States Patent
Li et al.

(10) Patent No.: US 9,461,149 B2
(45) Date of Patent: Oct. 4, 2016

(54) NANOWIRE STRUCTURE WITH SELECTED STACK REMOVED FOR REDUCED GATE RESISTANCE AND METHOD OF FABRICATING SAME

(71) Applicant: GLOBALFOUNDRIES INC., Grand Cayman (KY)

(72) Inventors: Hongmei Li, Williston, VT (US); Junjun Li, Williston, VT (US); Xiaoping Liang, Hopewell Junction, NY (US); Kai Zhao, Hopewell Junction, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/484,916

(22) Filed: Sep. 12, 2014

(65) Prior Publication Data

US 2016/0079394 A1   Mar. 17, 2016

(51) Int. Cl.
*H01L 21/00* (2006.01)
*H01L 29/66* (2006.01)
*H01L 29/78* (2006.01)

(52) U.S. Cl.
CPC ....... *H01L 29/66795* (2013.01); *H01L 29/785* (2013.01)

(58) Field of Classification Search
None
See application file for complete search history.

(56) References Cited

U.S. PATENT DOCUMENTS

| 8,472,239 | B2 | 6/2013 | Chang et al. |
| 2010/0207208 | A1* | 8/2010 | Bedell et al. ................. 257/346 |
| 2010/0295021 | A1* | 11/2010 | Chang et al. .................. 257/24 |
| 2012/0007051 | A1* | 1/2012 | Bangsaruntip et al. ......... 257/24 |
| 2013/0037070 | A1* | 2/2013 | Narducci ................ H01L 27/16 136/203 |
| 2014/0084249 | A1 | 3/2014 | Basker et al. |
| 2014/0210013 | A1* | 7/2014 | Kim ..................... H01L 27/092 257/369 |

* cited by examiner

*Primary Examiner* — Julio J Maldonado
*Assistant Examiner* — Stanetta Isaac
(74) *Attorney, Agent, or Firm* — Scully, Scott, Murphy & Presser, P.C.

(57) ABSTRACT

Methods to fabricate a stacked nanowire field effect transistor (FET) with reduced gate resistance are provided. The nanowire stack in the stacked nanowire FET can be provided by first forming a material stack of alternating sacrificial material layers and nanowire material layer. The sacrificial material layers and selected nanowire material layers in the material stack are subsequently removed to increase a vertical distance between two active nanowire material layers.

15 Claims, 11 Drawing Sheets

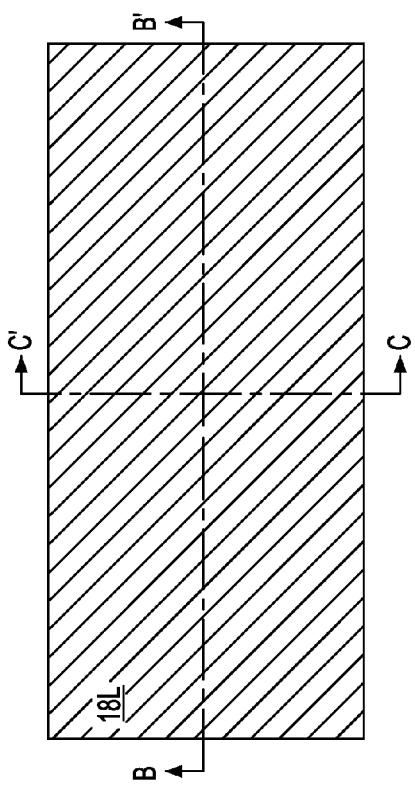
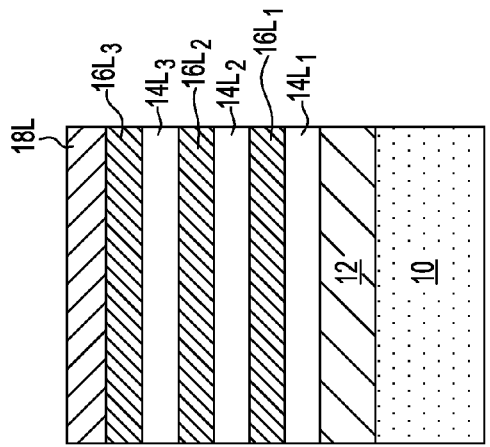
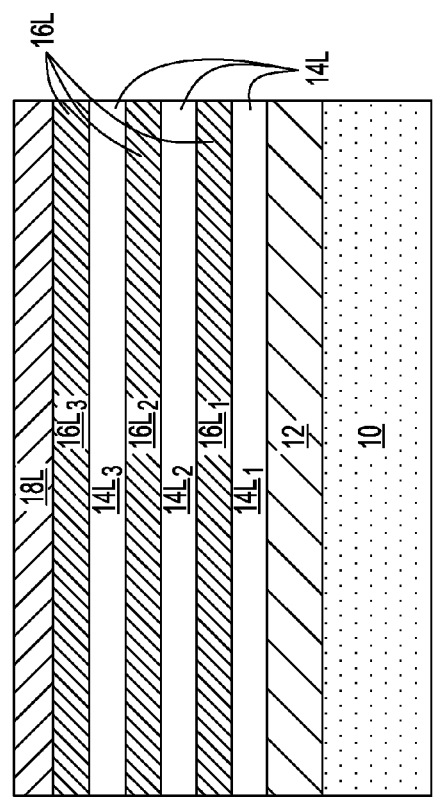
FIG. 1A
FIG. 1B
FIG. 1C

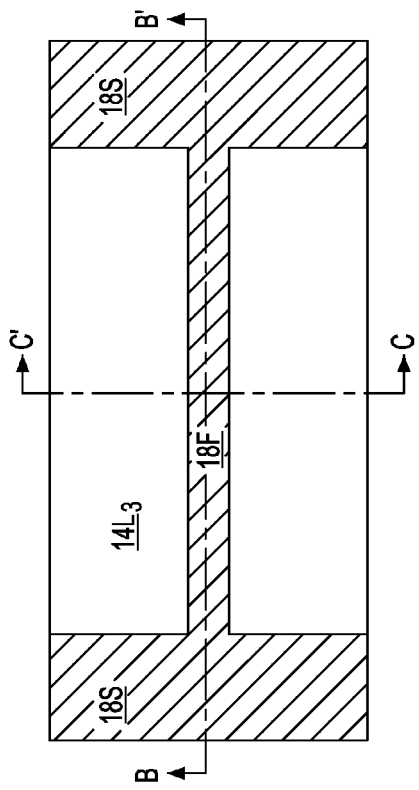
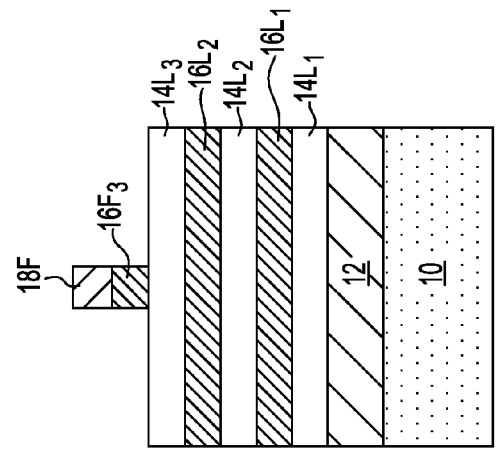
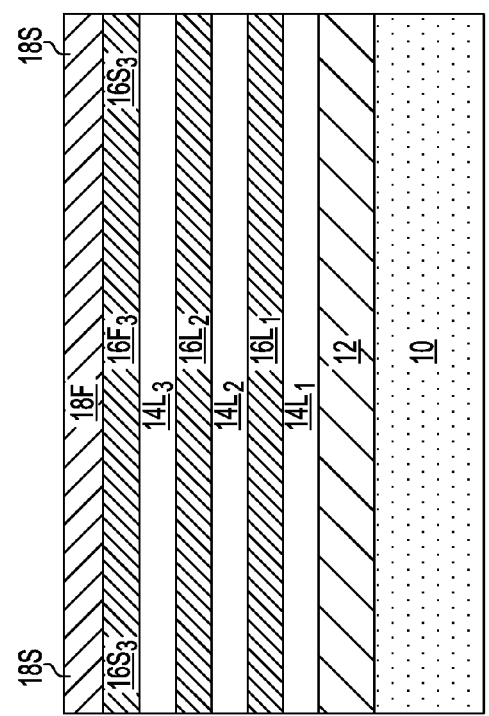
FIG. 2A
FIG. 2C
FIG. 2B

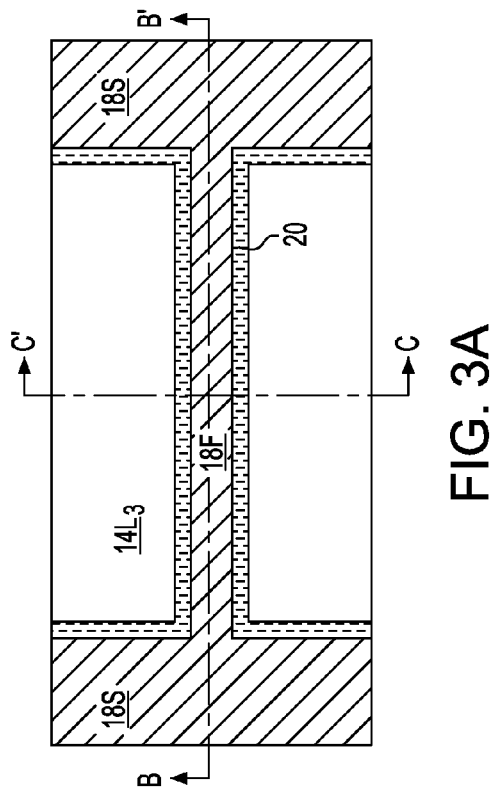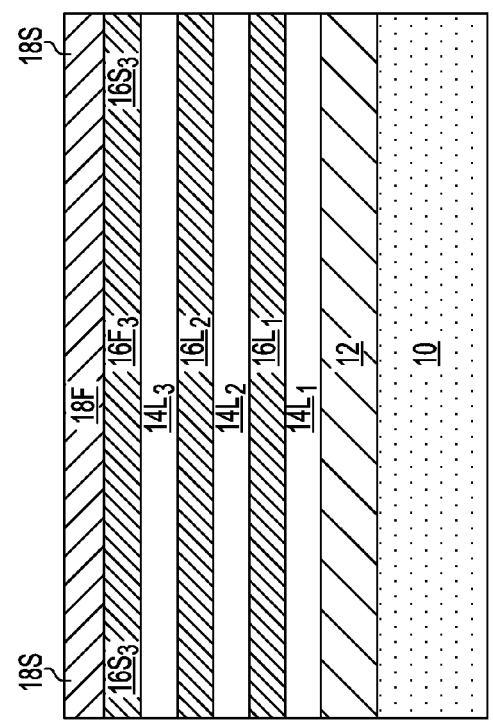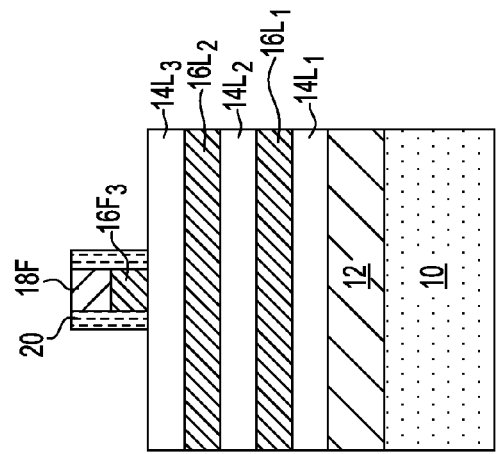

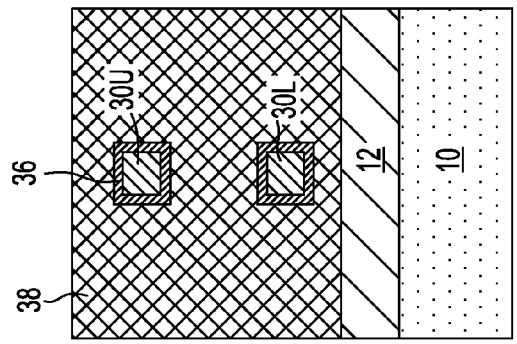
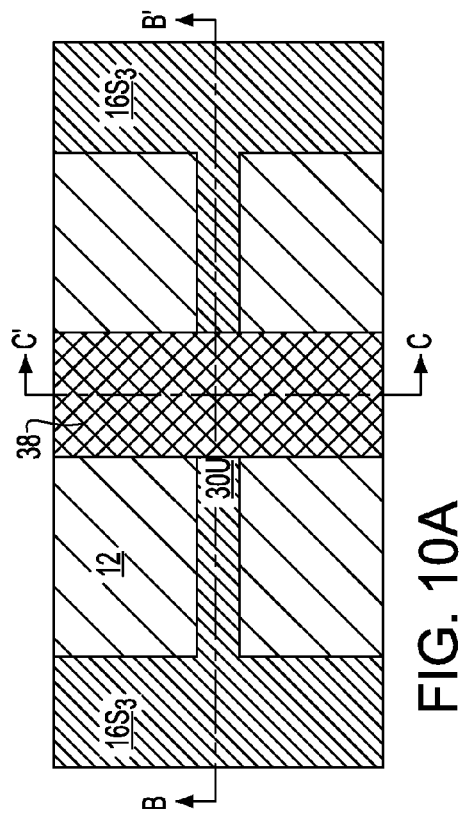
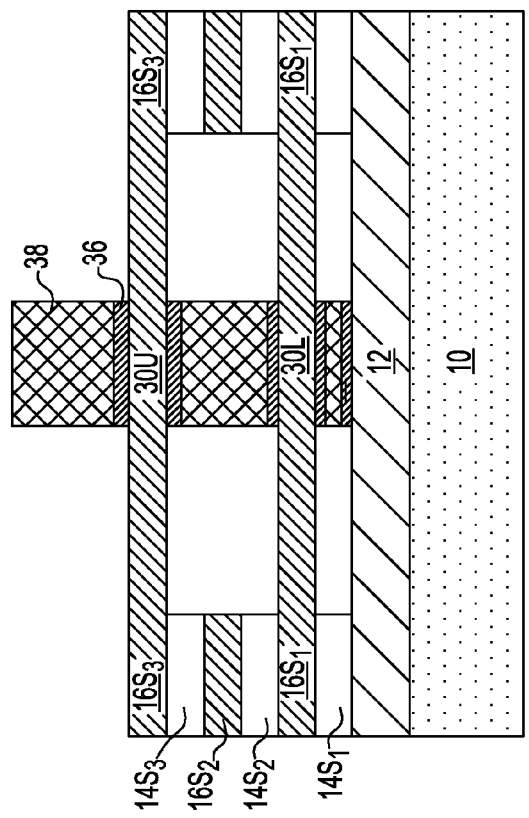

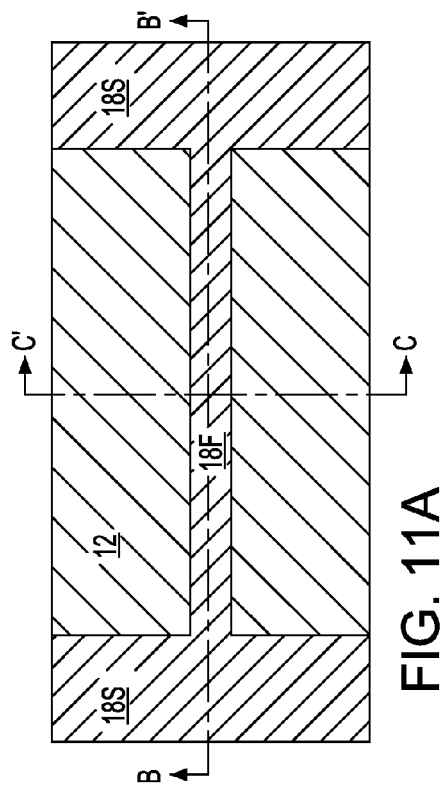
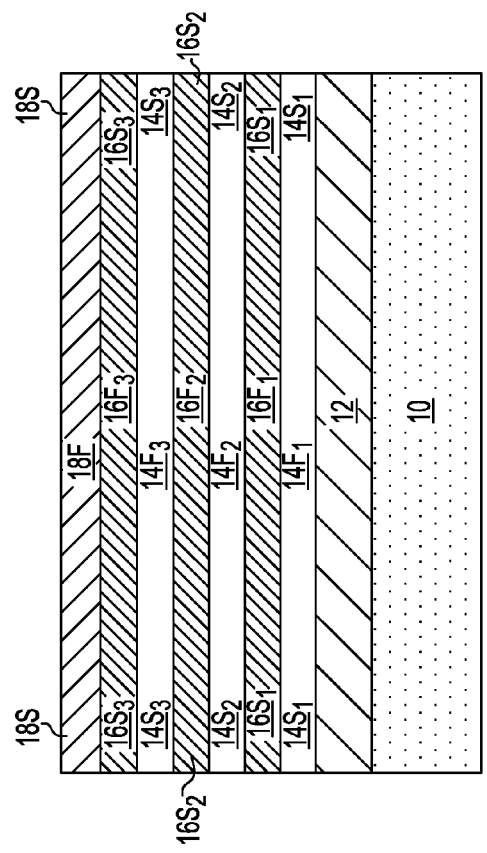
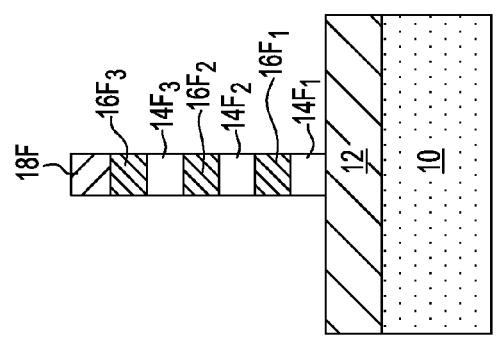
FIG. 11A
FIG. 11B
FIG. 11C

NANOWIRE STRUCTURE WITH SELECTED STACK REMOVED FOR REDUCED GATE RESISTANCE AND METHOD OF FABRICATING SAME

BACKGROUND

The present application relates to a semiconductor structure, and particularly to stacked nanowire field effect transistors with reduced gate resistance and methods of manufacturing the same.

Semiconductor devices employing a semiconductor nanowire, such as nanowire field effect transistor (FETs), provide a tight control of the channel, enabling suppression of off-current at a level not possible with conventional fin FETs. However, nanowire FETs usually offer less on-current density for a given chip area than conventional fin FETs.

On way to increase the on-current density of nanowire FETs is to form a vertical stack of semiconductor nanowires. However, the narrow spacing (typically in the order of 5 nm-10 nm) between stacked semiconductor nanowires makes it difficult to fill in the spaces with a low resistance metal, such as tungsten, when forming gate structures, resulting in high gate resistance in stacked nanowire FETs. Therefore, there remains a need to reduce the gate resistance of certain high performance nanowire FETs for high-frequency applications.

SUMMARY

The present application provides methods to fabricate a stacked nanowire field effect transistor (FET) with reduced gate resistance. The nanowire stack in the stacked nanowire FET can be provided by first forming a material stack of alternating sacrificial material layers and nanowire material layers. The sacrificial material layers and selected nanowire material layers in the material stack are subsequently removed to increase a vertical distance between two active nanowire material layers.

In one aspect of the present application, a method of forming a semiconductor structure is provided.

In one embodiment, the method includes first forming a material stack on a substrate. The material stack includes, from bottom to top, at least a first nanowire material layer, a second nanowire material layer and a top nanowire material layer that are separated from each other by a respective sacrificial material layer. After forming a hard mask layer on the top nanowire material layer of the material stack, the hard mask layer and the top nanowire material layer are patterned to provide a vertical stack of a hard mask layer portion and a top nanowire material layer portion. Each of the hard mask layer portion and the top nanowire material layer portion includes a fin portion connected at each end to a respective supporting portion. Next, a sacrificial spacer is formed on each sidewall of the vertical stack. After sequentially removing exposed portions of a sacrificial material layer located beneath the top nanowire material layer portion that are not covered by the sacrificial spacer or the vertical stack to expose portions of the second nanowire material layer, portions of the second nanowire material layer that are not covered by the supporting portions of the hard mask layer portion and the sacrificial spacer, at least a remaining portion of the sacrificial material layer, the first nanowire material layer and another sacrificial material layer overlying the first nanowire material layer to provide a sacrificial material layer portion, a first nanowire material layer portion and another sacrificial material layer portion are patterned. Each of the sacrificial material layer portion, the first nanowire material layer portion and the another sacrificial material layer portion includes a fin portion connected at each end to a respective supporting portion. Fin portions of the sacrificial martial layer portion and the another sacrificial material layer portion are then removed.

In another embodiment, the method includes first forming a material stack on a substrate. The material stack includes alternating nanowire material layers and sacrificial material layers. At least one nanowire material layer located between an upper nanowire material layer and a lower nanowire material layer has an etch selectivity with respect to each of the upper and lower nanowire material layers. Next, the material stack is patterned to form a vertical stack of alternating nanowire material layer portions and sacrificial material layer portions. Each of the alternating nanowire material layer portions and sacrificial material layer portions comprises a fin portion connected at each end to a respective supporting portion. After removing the fin portion of the at least one nanowire material layer portion, the fin portions of the sacrificial material layer portions are removed.

In another aspect of the present application, a semiconductor structure is provided. The semiconductor structure includes a first group of stacked nanowires spaced from each other by a first vertical distance, a second group of stacked nanowires spaced from each other by a second vertical distance. The first vertical distance is more than two times greater than the second vertical distance.

BRIEF DESCRIPTION OF SEVERAL VIEWS OF THE DRAWINGS

FIG. 1A is a top-down view of an exemplary semiconductor structure after forming a material stack of alternating sacrificial material layers and nanowire material layers on a substrate and a hard mask layer according to an embodiment of the present application.

FIG. 1B is a vertical cross-sectional view of the semiconductor structure of FIG. 1A along line B-B'.

FIG. 1C is a vertical cross-sectional view of the semiconductor structure of FIG. 1A along line C-C'.

FIG. 2A is a top-down view of the semiconductor structure of FIGS. 1A-1C after patterning the hard mask layer and a third nanowire material layer in the material stack to form a vertical stack of a hard mask layer portion and a third nanowire material layer portion.

FIG. 2B is a vertical cross-sectional view of the semiconductor structure of FIG. 2A along line B-B'.

FIG. 2C is a vertical cross-sectional view of the exemplary semiconductor structure of FIG. 2A along line C-C'.

FIG. 3A is a top-down view of the semiconductor structure of FIGS. 2A-2C after forming a sacrificial spacer on each sidewall of the vertical stack of the hard mask layer portion and the third nanowire material layer portion.

FIG. 3B is a vertical cross-sectional view of the semiconductor structure of FIG. 3A along line B-B'.

FIG. 3C is a vertical cross-sectional view of the semiconductor structure of FIG. 3A along line C-C'.

FIG. 10A is a top-down view of the semiconductor structure of FIGS. 8A-8C after forming a gate structure.

FIG. 10B is a vertical cross-sectional view of the semiconductor structure of FIG. 10A along line B-B'.

FIG. 10C is a vertical cross-sectional view of the semiconductor structure of FIG. 10A along line C-C'.

FIG. 11A is a top-down view of the semiconductor structure of FIGS. 1A-1C after patterning the hard mask layer and the material stack of alternating sacrificial material layers and nanowire material layers.

FIG. 11B is a vertical cross-sectional view of the semiconductor structure of FIG. 11A along line B-B'.

FIG. 11C is a vertical cross-sectional view of the semiconductor structure of FIG. 11A along line C-C'.

DETAILED DESCRIPTION

Figure 4A:
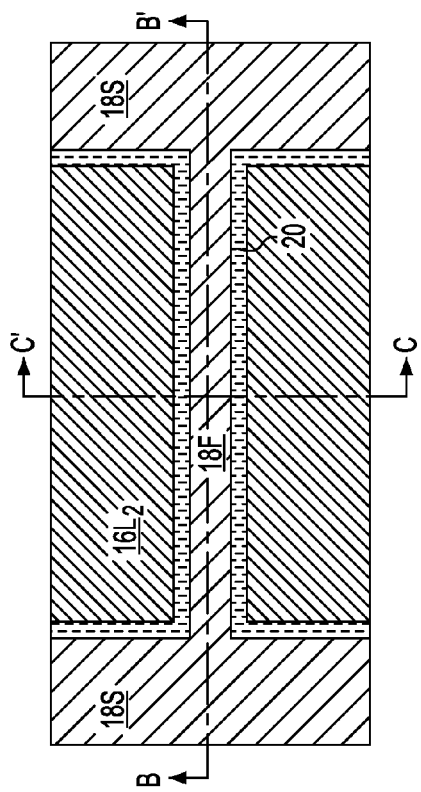
FIG. 4A is a top-down view of the semiconductor structure of FIGS. 3A-3C after patterning a third sacrificial material layer in the material stack to provide a patterned third sacrificial material layer.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring to FIGS. 1A-1C, there is illustrated an exemplary semiconductor structure that can be employed in embodiments of the present application. The semiconductor structure includes, from bottom to top, a handle substrate 10, an insulator layer 12, a material stack of alternating sacrificial material layers 14L and nanowire material layers 16L, and a hard mask layer 18L.

The handle substrate 10 can include a semiconductor material. Exemplary semiconductor materials that can be employed as the handle substrate 10 include, but are not limited to, silicon (Si), germanium (Ge), silicon germanium (SiGe), silicon germanium carbide (SiGeC), silicon carbide (SiC), gallium arsenide (GaAs), indium arsenide (InAs), indium phosphide (InP) and other III/V and II/VI compound semiconductor materials. In one embodiment, the handle substrate 10 is composed of Si. The thickness of the handle substrate 10 can be from 50 microns to 2 mm, although lesser and greater thicknesses can also be employed. The handle substrate 10 provides mechanical support for the insulator layer 12, the material stack (14L, 16L) and the hard mask layer 18L.

The insulator layer 12 includes a dielectric material such as silicon oxide, silicon nitride, silicon oxynitride, or a combination thereof. The insulator layer 12 can have a thickness in a range from 5 nm to 500 nm, although lesser and greater thicknesses can also be employed.

In one embodiment and as shown in FIGS. 1B and 1C, the material stack (14L, 16L) that is formed on the insulator layer 12 includes there pairs of alternating sacrificial material layers 14L and nanowire material layers 16L with a first sacrificial material layer $14L_1$ disposed on the insulator layer 12, a first nanowire material 16L$_1$ disposed on the first sacrificial material layer $14L_1$, a second sacrificial material layer $14L_2$ disposed on the first nanowire material layer $16L_1$, a second nanowire material layer $16L_2$ disposed on the second sacrificial material layer $14L_2$, a third sacrificial material layer $14L_3$ disposed on the second nanowire material layer $16L_2$, and a third nanowire material layer $16L_3$ disposed on the third sacrificial material layer $14L_3$. Although three pairs of sacrificial material layer 14L and nanowire material layer 16L are described and illustrated, the present application is not limited to such numbers of pairs. Instead, more pairs of sacrificial material layers 14L and nanowire material layers 16L may be included. In some embodiments of the present application, the number of the sacrificial material layers 14L and the nanowire material layers 16L may not be the same. For example, there may be two layers of sacrificial material layers 14L and three layer of nanowire material layers 16L in the material stack (14L, 16L) with one of the nanowire material layers formed directly on the insulator layer 12.

The sacrificial material layers 14L include a first semiconductor material that can be removed selective to a second semiconductor material of the nanowire material layers 16L. Each of the sacrificial material layers 14L and the nanowire material layers 16L may include Si, Ge, SiGe, GaAs, InSb, GaP, GaSb, InAlAs, InGaAs, GaSbP, GaAsSb, and InP. In one embodiment and when the semiconductor structure is used in providing a p-type FET, the sacrificial material layers 14L are composed of Si and the nanowire material layers 16L are composed of SiGe. In another embodiment and when the semiconductor structure is used in providing an n-type FET, the sacrificial material layers 14L are composed of SiGe and the nanowire material layers 16L are composed of Si.

In one embodiment, the material stack (14L, 16L) shown in FIGS. 1A-1C can be formed by first providing a semiconductor-on-insulator (SOI) substrate that includes the handle layer 10, the insulator layer 12 and a top semiconductor layer which can be the bottommost layer in the material stack (14L, 16L). The sacrificial material layers 14L and nanowire material layers 16L in the material stack (14L, 16L) can then be formed on the SOI substrate by a series of epitaxial deposition processes such that each of the sacrificial material layers 14L can be deposited as a single crystalline material layer in epitaxial alignment with an underlying material layer, and each of the nanowire material layers 16L can be deposited as a single crystalline semiconductor material layer in epitaxial alignment with an underlying material layer. Exemplary epitaxial deposition processes that can be employed to form the material stack (14L, 16L) include, but are not limited to, chemical vapor deposition (CVD), plasma enhanced chemical vapor deposition (PECVD) or atomic layer deposition (ALD).

The thicknesses of the sacrificial material layers 14L and the nanowire material layers 16L are selected such that the epitaxial alignment of the sacrificial material layers 14L and the nanowire material layers 16L can be maintained throughout the entirety of the material stack (14L, 16L). Thus, the thickness of each of the sacrificial material layers 14L and the nanowire material layers 16L is less than the corresponding critical thickness, which is the thickness at which an epitaxial material begins to lose epitaxial registry with the underlying single crystalline layer by developing dislocations. For example, the thickness of each of the sacrificial material layers 14L and the nanowire material layers 16L can be in a range from 3 nm to 60 nm, although lesser and greater thicknesses can also be employed.

The hard mask layer 18L can be formed on top of the material stack (14L, 16L). The hard mask layer 18L can include a dielectric material such as silicon nitride, silicon oxide, or a dielectric metal oxide, and can be formed by CVD. The thickness of the hard mask layer 18L can be in a range from 3 nm to 60 nm, although lesser and greater thicknesses can also be employed.

Referring to FIGS. 2A-2C, the hard mask layer 18L and the third nanowire material layer $16L_3$ can be patterned to form a vertical stack of a hard mask layer portion (18F, 18S) and a third nanowire material layer portion ($16F_3$, $16S_3$). Specifically, a photoresist layer (not shown) can be applied over the hard mask layer 18L and lithographically patterned to cover a contiguous area. The shape of the contiguous area covered by the patterned photoresist layer can be selected to include a fin portion arranged between two supporting portions. The supporting portions have a width greater than a width of the fin portion. Subsequently, the pattern in the photoresist layer can be transferred through the hard mask layer 18L and the third nanowire material layers $16L_3$ by an anisotropic etch using the third sacrificial material layer $14L_3$ as an etch stop. The remaining portion of the hard mask layer 18L is herein referred to as the hard mask layer portion including a fin portion 18F connected at each end to a respective supporting portion 18S. The remaining portion of the third nanowire material layer $16L_3$ is herein referred to as the third nanowire material layer portion including a fin portion $16F_3$ connected at each end to a respective supporting portion $16S_3$. The width of the fin portion $16F_3$ of the third nanowire material layer portion ($16F_3$, $16S_3$) can be from 5 to 60 nm, although lesser and greater widths can also be employed. Besides the lithography patterning, other patterning techniques such as sidewall imaging transfer, multiple patterning, or the combination of those techniques can be used to pattern the hard mask layer 18L and the third nanowire material layer $16L_3$. After forming the vertical stack of the hard mask layer portion (18F, 18S) and the third nanowire material layer portion ($16F_3$, $16S_3$), the patterned photoresist layer can be removed utilizing a conventional resist stripping process such as, for example, ashing.

Referring to FIGS. 3A-3C, a sacrificial spacer 20 can be formed on each sidewall of the vertical stack of the hard mask layer portion (18F, 18S) and the third nanowire material layer portion ($16F_3$, $16S_3$). The sacrificial spacer 20 includes a dielectric material such as silicon oxide, silicon nitride, or silicon oxynitride. The sacrificial spacer 20 can be formed by first providing a conformal sacrificial spacer material layer (not shown) on exposed surfaces of the hard mask layer portion (18F, 18S), the third nanowire material layer portion ($16F_3$, $16S_3$) and the third sacrificial material layer $14L_3$, and then etching the conformal sacrificial spacer material layer to remove horizontal portions of the conformal sacrificial spacer material layer. The conformal sacrificial spacer material layer can be provided by a deposition process including, for example, chemical vapor deposition (CVD), plasma enhanced chemical vapor deposition (PECVD), or physical vapor deposition (PVD). The etching of the conformal sacrificial spacer material layer may be performed by a dry etch process such as, for example, RIE. The remaining portions of the conformal sacrificial spacer material layer constitute the sacrificial spacers 20. The width of the sacrificial spacer 20, as measured at the base of the sacrificial spacer 20 can be from 5 nm to 100 nm, although lesser and greater widths can also be employed.

Figure 4C:
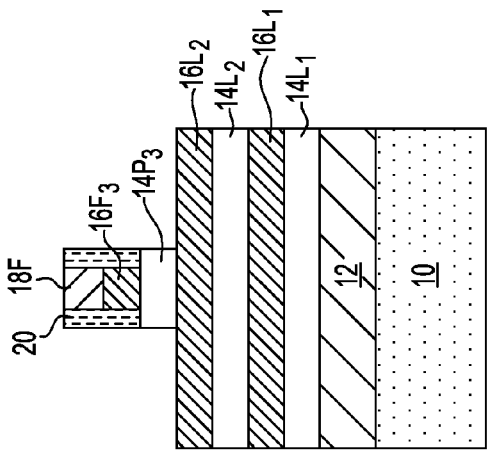
FIG. 4C is a vertical cross-sectional view of the semiconductor structure of FIG. 4A along line C-C'.
Figure 4B:
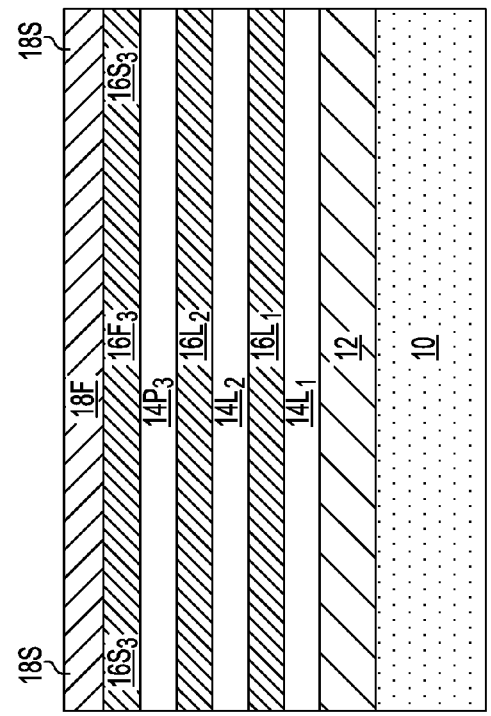
FIG. 4B is a vertical cross-sectional view of the semiconductor structure of FIG. 4A along line B-B'.

Referring to FIGS. 4A-4C, the third sacrificial material layer $14L_3$ can be patterned using a combination of the sacrificial spacers 20 and the vertical stack of the hard the hard mask layer portion (18F, 18S) and the third nanowire material layer portion ($16F_3$, $16S_3$) as an etch mask. Specifically, portions of the third sacrificial material layer 14L that are not covered by the sacrificial spacers 20 or the vertical stack of the hard mask layer portion (18F, 18S) and the third nanowire material layer portion ($16F_3$, $16S_3$) are removed utilizing an anisotropic etch, such as, for example, a RIE process. The remaining portion of the third sacrificial material layer $14L_3$ is herein referred to as the patterned third sacrificial material layer $14P_3$. The fin portion $16F_3$ of the third nanowire material portion ($16F_3$, $16S_3$) is thus encapsulated by the fin portion 18F of the hard mask layer portion (18F, 18S), the sacrificial spacer 20 and the patterned third sacrificial material layer $14P_3$ and is protected from an etch to be subsequently employed to remove a portion of the second nanowire material layer $16L_2$.

Figure 5A:
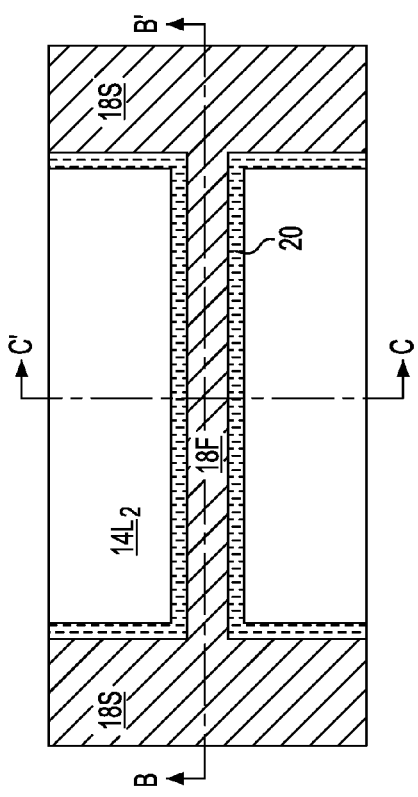
FIG. 5A is a top-down view of the semiconductor structure of FIGS. 4A-4C after removing a portion of a second nanowire material layer in the material stack.
Figure 5C:
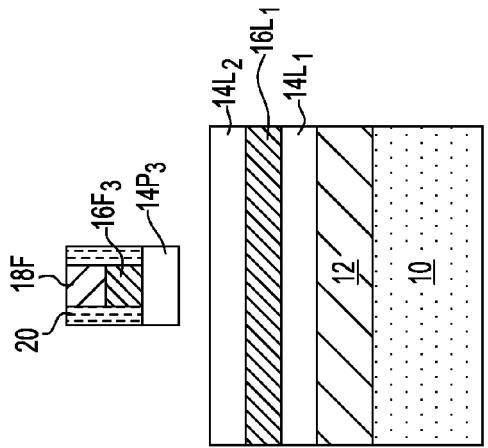
FIG. 5C is a vertical cross-sectional view of the semiconductor structure of FIG. 5A along line C-C'.
Figure 5B:
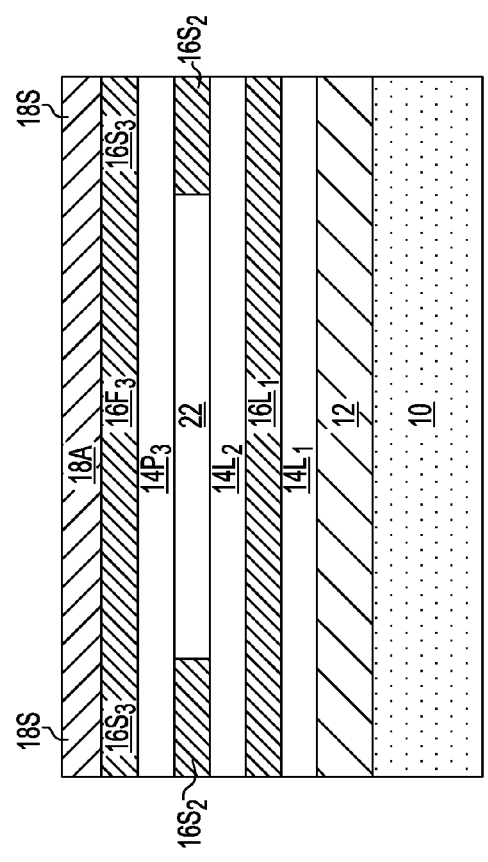
FIG. 5B is a vertical cross-sectional view of the semiconductor structure of FIG. 5A along line B-B'.

Referring to FIGS. 5A-5C, a portion of the second nanowire material layer $16L_2$ that is not covered by the supporting portions 18S of the hard mask layer portion (18F, 18S) can be removed selective to the first semiconductor material of the sacrificial material layers 14L by an isotropic etch to provide a void 22 between the second sacrificial material layer $14L_2$ and the patterned third sacrificial material layer $14P_3$. The selective removal of the portion of the second nanowire material layer $16L_2$ can be effected by a dry etch, a wet chemical etch or a combination thereof. In one embodiment where each of the nanowire material layers 16L is composed of Si and each of the sacrificial material layers 14L is composed of SiGe, the second nanowire material layer 16L$_2$ can be selectively removed using a wet etchant, such as, for example, ammonium hydroxide or potassium hydroxide. In another embodiment where each of the nanowire material layers 16L is composed of SiGe and each of the sacrificial material layer is composed of Si, a wet etch employing hydrofluoric acid may be utilized to selectively remove SiGe. The isotropic etching process employed does not remove end portions (herein referred to as supporting portions 16S$_2$) of the second nanowire material layer 16L$_2$, after removal, the patterned third sacrificial material layer 14P$_3$ is still supported at both ends by the supporting portions 16S$_2$ of the second nanowire material layer 16L$_2$. In addition, due to the encapsulation of the fin portion 16F$_3$ of the third nanowire material portion (16F$_3$, 16S$_3$) by the fin portion 18F of the hard mask layer portion (18F, 18S), the sacrificial spacer 20 and the patterned third sacrificial material layer 14P$_3$, the isotropic etching process does not affect the fin portion 16F$_3$ of the third nanowire material layer portion (16F$_3$, 16S$_3$).

Figure 6A:
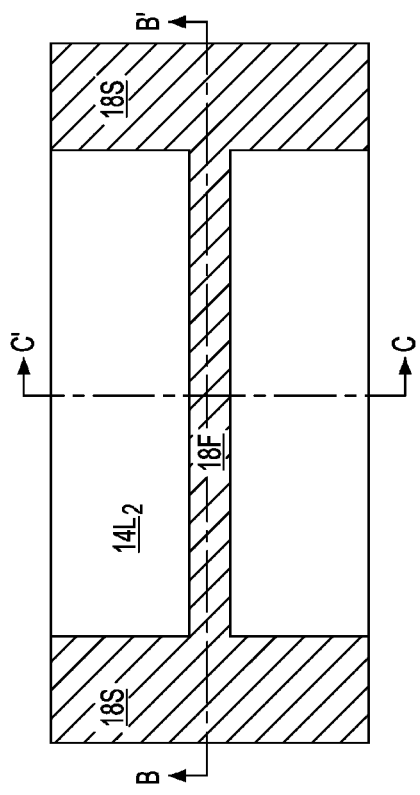
FIG. 6A is a top-down view of the semiconductor structure of FIGS. 5A-5C after removing the sacrificial spacer from each sidewall of the vertical stack of the hard mask layer portion and the third nanowire material layer portion.
Figure 6B:
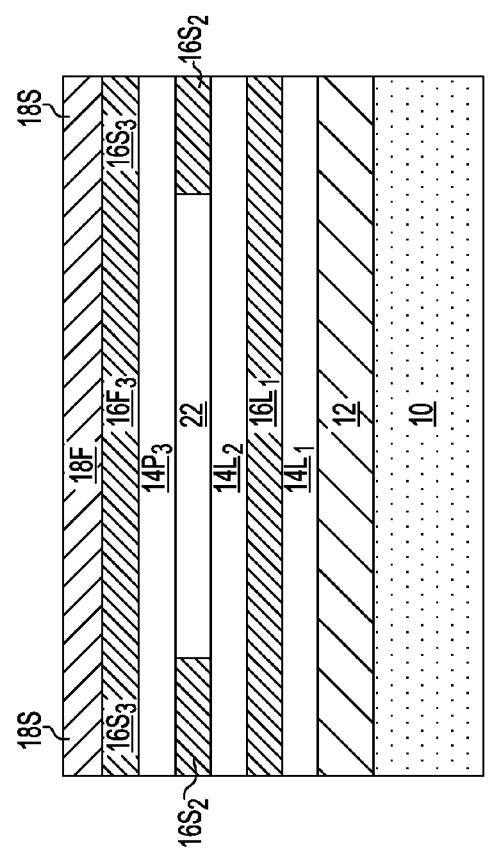
FIG. 6B is a vertical cross-sectional view of the semiconductor structure of FIG. 6A along line B-B'.
Figure 6C:
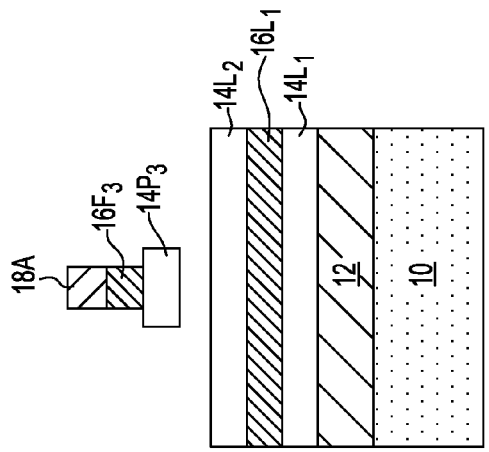
FIG. 6C is a vertical cross-sectional view of the semiconductor structure of FIG. 6A along line C-C'.

Referring to FIGS. 6A-6C, the sacrificial spacer 20 can be removed from each sidewall of the vertical stack of the hard mask layer portion (18F, 18S) and the third nanowire material layer portion (16F$_3$, 16S$_3$) by an anisotropic etch, such as, for example, a RIE process. The removal of the sacrificial spacers 20 physically exposes the sidewalls of the vertical stack of the hard mask layer portion (18F, 18S) and the third nanowire material layer portion (16F$_3$, 16S$_3$).

Figure 7C:
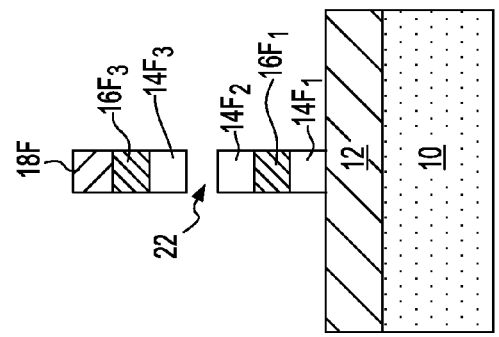
FIG. 7C is a vertical cross-sectional view of the semiconductor structure of FIG. 7A along line C-C'.
Figure 7A:
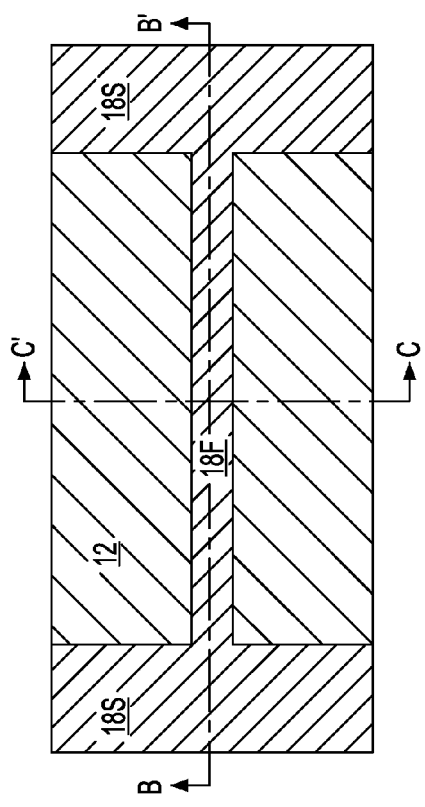
FIG. 7A is a top-down view of the exemplary semiconductor structure of FIGS. 6A-6C after patterning the patterned third sacrificial material layer, a second sacrificial material layer, a first nanowire material layer and a first sacrificial material layer in the material stack.
Figure 7B:
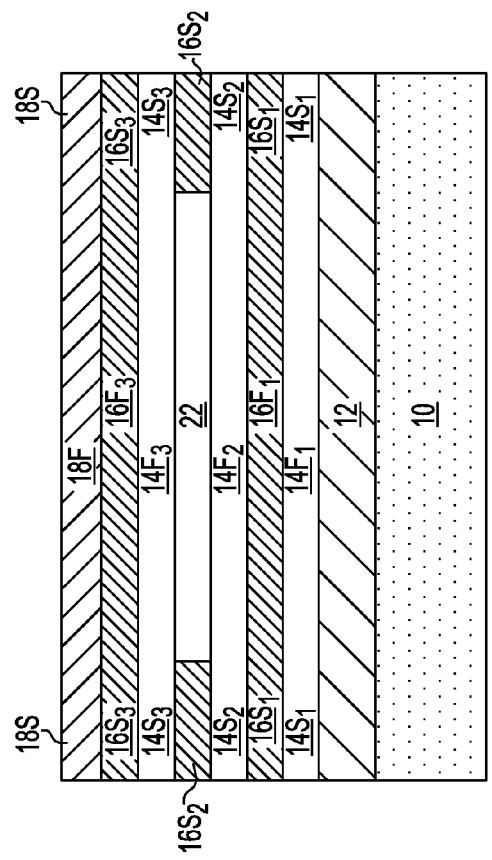
FIG. 7B is a vertical cross-sectional view of the semiconductor structure of FIG. 7A along line B-B'.

Referring to FIGS. 7A-7C, portions of the patterned third sacrificial material layer 14P$_3$, the second sacrificial material layer 14L$_2$, the first nanowire material layer 16L$_1$ and the first sacrificial material layer 14L$_1$ that are not covered by the vertical stack of the hard mask layer portion (18F, 18S) and the third nanowire material layer portion (16F$_3$, 16S$_3$) are removed by a dry etch, such as, for example, RIE. The remaining portion of the patterned third sacrificial material layer 14P$_3$ is herein referred to as the third sacrificial material layer portion including a fin portion 14F$_3$ and supporting portions 14S$_3$. The remaining portion of the second sacrificial material layer is herein referred to as the second sacrificial material layer portion including a fin portion 14F$_2$ and supporting portions 14S$_2$. The remaining portion of the first nanowire material layer 16L$_1$ is herein referred to as the first nanowire material layer portion including a fin portion 16F$_1$ and supporting portions 16S$_1$. The remaining portion of the first sacrificial material layer is herein referred to as the first sacrificial material layer portion including a fin portion 14F$_1$ and supporting portions 14S$_1$.

Figure 8A:
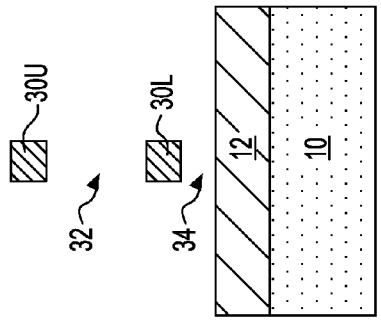
FIG. 8A is a top-down view of the semiconductor structure of FIGS. 7A-7C after removing fin portions of a first, a second and a third sacrificial material layer portions.
Figure 8B:
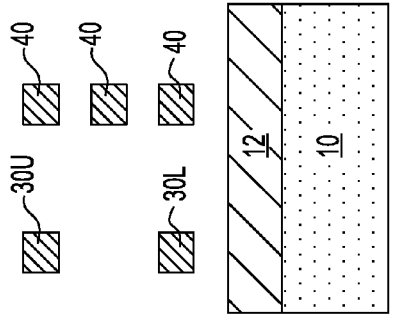
FIG. 8B is a vertical cross-sectional view of the semiconductor structure of FIG. 8A along line B-B'.
Figure 9:
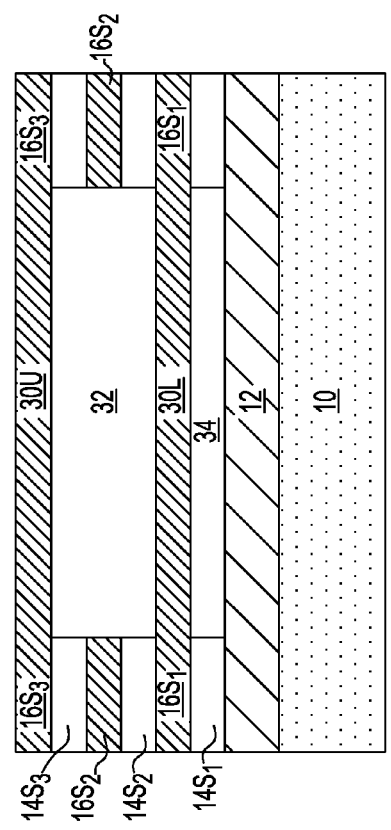
FIG. 9 is a vertical cross-sectional view of the semiconductor structure of FIG. 8C after forming a second group of stacked nanowires in a second portion of the substrate by only removing sacrificial material layer portions.

Referring to FIGS. 8A-8B, the fin portions 14F$_1$, 14F$_2$, 14F$_3$ of the first, the second and the third sacrificial material layer portions can be removed using a selective isotropic etch that only removes the first semiconductor martial of the sacrificial material layers 14L without etching the second semiconductor material of the nanowire material layers 16L. The resulting structure define a lower nanowire 30L which is the fin portion 16F$_1$ of the first nanowire material layer portion (16F$_1$, 16S$_1$) and a upper nanowire 30U which is the fin portion 16F$_3$ of the third nanowire material layer portion (16F$_3$, 16S$_3$). The removal of the fin portions 14F$_2$, 14F$_3$ of the second and the third sacrificial material layer portions provide a first void 32 between the lower nanowire 30L and the upper nanowire 30U. The removal of the fin portion 14F$_1$ of the first sacrificial material layer portion (14F$_1$, 14S$_1$) provides a second void 34 between the lower nanowire 30L and the insulator layer 12. Due to the removal of the fin portion 16F$_2$ of the second nanowire material layer portion (16F$_2$, 14S$_2$), the vertical distance between the lower nanowire 30L and the upper nanowire 30U is defined by a total thickness of one nanowire material layer 16L and two sacrificial material layers 14L, thus is significantly increased when comparing to a conventional stacked nanowire FET formed by removing only the sacrificial material layer portions in the vertical stacks of alternating sacrificial material layer portions and nanowire material layer portions in which the vertical distance between adjacent nanowires 40 is defined by the thickness of a single sacrificial material layer (FIG. 9). The relatively wider spacing between the lower nanowire 30L and the upper nanowire 30U of the present application would allow easy filling the void 32 with a low resistance metal (e.g., tungsten) to reduce the gate resistance in a stacked nanowire FET subsequently formed. The upper and lower nanowire 30U, 30L and nanowires 40 can be easily formed on a same substrate. Therefore, it is possible to obtain nanowire FETs in one device area with improved on-current and nanowire FETs in another device area with reduced gate resistance (see FIG. 9).

In some embodiments of the present application, a portion of the insulator layer 12 underneath the lower nanowire 30L may be removed to further increase the vertical distance between the lower nanowire 30L and the insulator layer 12 (not shown).

After, or prior to, the removal of the fin portions 14F$_1$, 14F$_2$, 14F$_3$ of the first, the second and the third sacrificial material layer portions, another etch process can be performed to remove the hard mask layer portion (18F, 18S). An anisotropic etch or an isotropic etch can be employed. For example, an anisotropic etch that is selective to the second semiconductor material of the nanowire material layer 16L can be performed to remove the hard mask layer portion (18F, 18S).

Subsequently, the nanowires 30L, 30U may be rounded using an annealing process under hydrogen or through oxidation (not shown).

Referring to FIGS. 10A-10B, a gate structure may be formed on the nanowires 30L, 30U, wrapping around a channel portion of each of the nanowires 30L, 30U. The gate structure may comprise a gate dielectric 36 present on all exposed surfaces of the nanowires 30L, 30U in the channel portion and a gate electrode 38 located over the gate dielectric 36. The gate structure can be formed by first depositing a conformal gate dielectric layer (not shown) around the nanowires 30L, 30U and a gate electrode layer (not shown) on the gate dielectric layer. The gate electrode layer fills the first and the second voids 32, 34. The gate dielectric layer and the gate electrode layer are then patterned by an anisotropic etch employing a patterned photoresist (not shown) as a mask. The remaining portion of the gate dielectric layer constitutes the gate dielectric 36, and the remaining portion of the at least one conductive material layer constitutes the gate electrode 38.

The conformal gate dielectric layer can include a dielectric metal oxide having a dielectric constant that is greater than the dielectric constant of silicon oxide, e.g., 3.9. Typically, the gate dielectric layer that is employed has a dielectric constant greater than 4.0, with a dielectric constant of greater than 8.0 being more typical. Such dielectric materials are referred to herein as a high-k dielectric material. Examples of high-k dielectric material include, but are not limited to, $HfO_2$, $ZrO_2$, $La_2O_3$, $Al_2O_3$, $TiO_2$, $SrTiO_3$, $LaAlO_3$, $Y2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Multilayered stacks of these high-k dielectric materials can also be employed as the gate dielectric layer. Each value of x is independently from 0.5 to 3 and each value of y is independently from 0 to 2.

The conformal gate dielectric layer can be formed by methods well known in the art. In one embodiment, the gate dielectric layer can be formed by a deposition process such as, for example, chemical vapor deposition (CVD) and atomic layer deposition (ALD). The gate dielectric layer that is formed can have a thickness from 0.9 nm to 6 nm, with a thickness ranging from 1.0 nm to 3 nm being more typical.

The gate electrode layer comprises any conductive material including, but not limited to, tungsten, titanium, tantalum, aluminum, nickel, ruthenium, palladium and platinum, an alloy of at least two elemental metals, and an elemental metal nitride (e.g., tungsten nitride, aluminum nitride, and titanium nitride).

The gate electrode layer can be formed utilizing a conventional deposition process including, for example, CVD, plasma enhanced chemical vapor deposition (PECVD), evaporation, PVD, sputtering, chemical solution deposition and ALD.

Subsequently, ion implantation may be performed to form a source region and a drain region on opposite sides of the gate structure (not shown).

While the present application has been described employing a gate-first scheme in which a permanent gate structure is formed, embodiments employing a gate-last scheme which a sacrificial gate structure is replaced with a permanent gate structure are expressly contemplated herein.

Figure 8C:
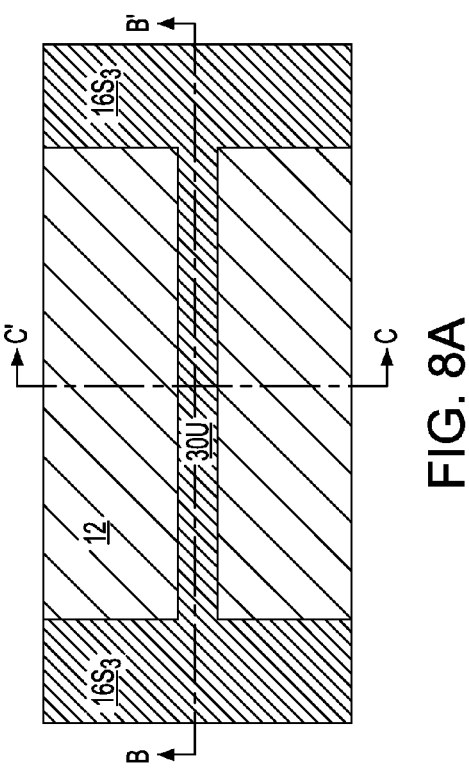
FIG. 8C is a vertical cross-sectional view of the semiconductor structure of FIG. 8A along line C-C'.

In some embodiments of the present application, the second nanowire material layer $16L_2$ may include a third semiconductor material that can be selectively removed with respect to the second semiconductor material of the first and the third nanowire material layers $16L_1$, $16L_3$. For example, when the nanowire material layers $16L$ are composed of SiGe, the germanium content in the second nanowire material layer $16L_2$ may be set to be at least 10% higher than that in the first and third nanowire material layers $16L_1$, $16L_3$ in order to be selectively removed. Thus, the semiconductor structure illustrated in FIGS. 8A-8C can be formed by an alternative method illustrated in FIGS. 11A-12C.

Referring to FIGS. 11A-11C, the hard mask layer 18L and the material stack of alternating sacrificial material layers 14L and nanowire material layers 16L of FIGS. 1A-1C can be patterned to form a hard mask layer portion (18F, 18S) and a vertical stack of alternating sacrificial material layer portions and nanowire material layer portions. The hard mask layer portion 18 includes a fin portion 18F connected at each end to a respective supporting portion 18S. Each of the sacrificial material layer portions includes a fin portion ($14F_1$, $14F_2$, $14F_3$) connected at each end to a respective supporting portion ($14S_1$, $14S_2$, $14S_3$) and each of the sacrificial material layer portions includes a fin portion ($16F_1$, $16F_2$, $16F_3$) connected at each end to a respective supporting portion ($16S_1$, $16S_2$, $16S_3$). Specifically, a pattern is produced by applying a photoresist layer over the hard mask layer 18L, exposing the photoresist layer to a pattern of radiation, and then developing the pattern into the photoresist layer utilizing a resist developer. Once the patterning of the photoresist is completed, portions of the hard mask layer 18L that are not covered by the patterned photoresist layer are removed using a selective etching process to provide the hard mask layer portion (18F, 18S). The hard mask layer portion (18F, 18S) is then employed as an etch mask to remove the exposed portions of the material stack of alternating sacrificial material layers 14L and nanowire material layers 16L. In one embodiment, the etch process that forms hard mask layer portion (18F, 18S) and a vertical stack of alternating sacrificial material layer portions and semiconductor material layer portions is an anisotropic etch including, but not limited to, RIE, ion bean etching, plasma etching and laser ablation.

Figure 12A:
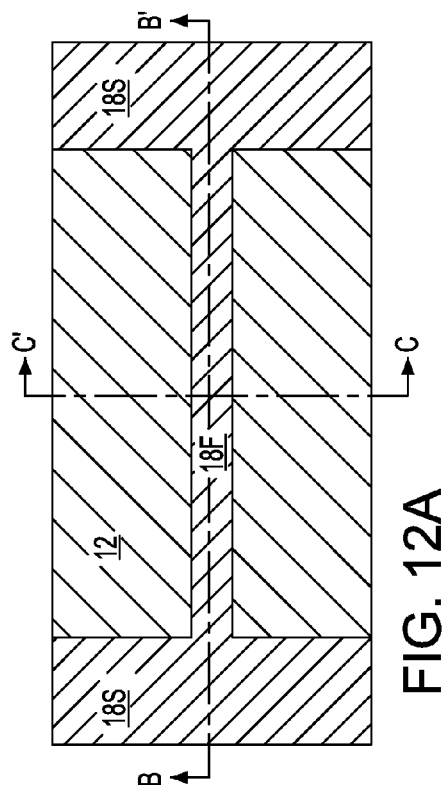
FIG. 12A is a top-down view of the semiconductor structure of FIGS. 11A-11C after removing a portion of a second nanowire material layer portion in the patterned material stack.
Figure 12B:
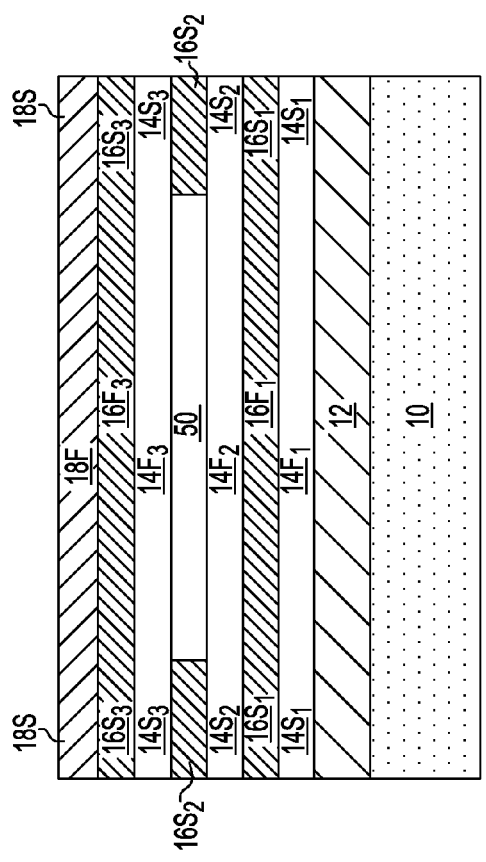
FIG. 12B is a vertical cross-sectional view of the semiconductor structure of FIG. 12A along line B-B'.
Figure 12C:
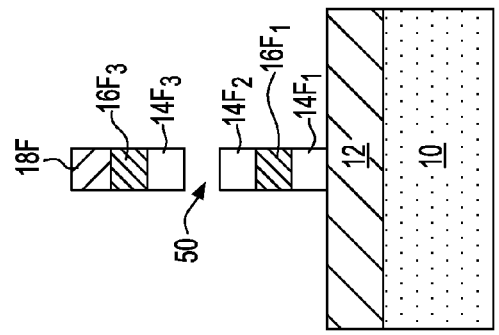
FIG. 12C is a vertical cross-sectional view of the semiconductor structure of FIG. 12A along line C-C'.

Referring to FIGS. 12A-12C, the fin portion $16F_2$ of the second nanowire material layer portion can be removed selective to the fin portions $16F_1$, $16F_3$ of the first and third nanowire material layer portions and the fin portions $14F_1$, $14F_2$, $14F_3$ of the first, second and third sacrificial material layer portions to provide a void 50 between the second and the third sacrificial material layer portions. In one embodiment, the portion $16F_2$ of the second nanowire material layer portion can be removed utilizing a selective wet etching process, such as, but not limited to $NH_4OH$: $H_2O_2$ based etchants. Subsequently, the fin portions $4F_1$, $14F_2$, $14F_3$ of the first, second and third sacrificial material layer portions can be selectively removed utilizing the process described above to provide the semiconductor structure illustrated in FIGS. 8A-8C.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure comprising:

forming a material stack on a substrate, the material stack comprising, from bottom to top, at least a first nanowire material layer, a second nanowire material layer and a top nanowire material layer that are separated from each other by a respective sacrificial material layer;

forming a hard mask layer on the top nanowire material layer of the material stack;

patterning the hard mask layer and the top nanowire material layer to provide a vertical stack of a hard mask layer portion and a top nanowire material layer portion, each of the hard mask layer portion and the top nanowire material layer portion including a fin portion connected at each end to a respective supporting portion;

forming a sacrificial spacer on each sidewall of the vertical stack;

removing exposed portions of a sacrificial material layer located beneath the top nanowire material layer portion that are not covered by the sacrificial spacer or the vertical stack to expose portions of the second nanowire material layer;

removing portions of the second nanowire material layer that are not covered by the supporting portions of the hard mask layer portion;

removing the sacrificial spacer;

patterning at least a remaining portion of the sacrificial material layer, the first nanowire material layer and another sacrificial material layer overlying the first nanowire material layer to provide a sacrificial material layer portion, a first nanowire material layer portion and another sacrificial material layer portion, each of the sacrificial material layer portion, the first nanowire material layer portion and the another sacrificial material layer portion including a fin portion connected at each end to a respective supporting portion; and removing fin portions of the sacrificial martial layer portion and the another sacrificial material layer portion.

2. The method of claim 1, wherein each of the sacrificial material layers comprises a first semiconductor material can be removed selective to a second semiconductor material of each of the nanowire material layers.

3. The method of claim 2, wherein each of the sacrificial material layers comprises Si and each of the nanowire material layers comprises SiGe.

4. The method of claim 1, wherein the material stack further comprises a third sacrificial material layer present between the substrate and the first nanowire material layer.

5. The method of claim 1, wherein the substrate comprises an insulator layer located on a handle layer.

6. The method of claim 5, further comprising removing a portion of the insulator layer located beneath the fin portion of the first nanowire material layer portion.

7. The method of claim 6, further comprising forming a gate dielectric around a channel portion of the fin portion of each of the first and the top nanowire material layer portions, and a gate electrode on the gate dielectric.

8. The method of claim 7, wherein the forming the gate dielectric and the gate electrode comprises:
   forming a conformal gate dielectric layer around the fin portion of each of the first and the top nanowire material layer portions;
   forming a gate electrode layer on the gate dielectric layer, the gate electrode layer filling in a space between the first and the top nanowire material layer portions and another space between the first nanowire material layer portion and the substrate; and
   patterning the conformal gate dielectric layer and the gate electrode layer.

9. A method of forming a semiconductor structure comprising:
   forming a material stack on a substrate, the material stack comprising alternating nanowire material layers and sacrificial material layers, wherein at least one nanowire material layer located between an upper nanowire material layer and a lower nanowire material layer has an etch selectivity with respect to each of the upper and lower nanowire material layers;
   patterning the material stack to form a vertical stack of alternating nanowire material layer portions and sacrificial material layer portions, wherein each of the alternating nanowire material layer portions and sacrificial material layer portions comprises a fin portion connected at each end to a respective supporting portion;
   removing the fin portion of the at least one nanowire material layer portion; and
   removing the fin portions of the sacrificial material layer portions.

10. The method of claim 9, wherein each of the sacrificial material layers comprises a first semiconductor material can be removed selective to semiconductor materials of the nanowire material layers.

11. The method of claim 9, wherein each of the sacrificial material layers comprises Si, and wherein each of the nanowire material layers comprises SiGe.

12. The method of claim 11, wherein the at least one nanowire material layer comprises SiGe having a germanium content at least 10 atomic % higher than a germanium content of SiGe in the upper and lower nanowire material layers.

13. The method of claim 9, further comprising forming a gate dielectric around a channel portion of the fin portion of each of the lower and the upper nanowire material layer portions, and a gate electrode on the gate dielectric.

14. The method of claim 13, wherein the forming the gate dielectric and the gate electrode comprises:
   forming a conformal gate dielectric layer around the fin portion of each of the upper and the lower nanowire material layer portions;
   forming a gate electrode layer on the gate dielectric layer, the gate electrode layer filling in at least one space between the upper and the lower nanowire material layer portions; and
   pattering the conformal gate dielectric layer and the gate electrode layer.

15. The method of claim 9, further comprising forming a hard mask layer on the material stack prior to the patterning the material stack.

* * * * *